United States Patent
Smith et al.

(10) Patent No.: US 9,578,689 B2
(45) Date of Patent: Feb. 21, 2017

(54) HIGH TEMPERATURE GAS LINE HEATER SYSTEM INCLUDING SILICONE FOAM RUBBER

(71) Applicants: Jason S. Smith, Oakwood Hills, IL (US); Casey C. Clausen, Portland, OR (US); James H. Kreisel, Winona, MN (US); Thomas J. Restis, Buffalo Grove, IL (US)

(72) Inventors: Jason S. Smith, Oakwood Hills, IL (US); Casey C. Clausen, Portland, OR (US); James H. Kreisel, Winona, MN (US); Thomas J. Restis, Buffalo Grove, IL (US)

(73) Assignee: DUREX INTERNATIONAL CORP., Cary, IL (US)

( * ) Notice: Subject to any disclaimer, the term of this patent is extended or adjusted under 35 U.S.C. 154(b) by 468 days.

(21) Appl. No.: 13/949,948

(22) Filed: Jul. 24, 2013

(65) Prior Publication Data
US 2014/0029925 A1    Jan. 30, 2014

Related U.S. Application Data

(60) Provisional application No. 61/675,191, filed on Jul. 24, 2012.

(51) Int. Cl.
| | |
|---|---|
| *E03B 7/10* | (2006.01) |
| *F24H 1/10* | (2006.01) |
| *H05B 3/02* | (2006.01) |
| *H05B 3/58* | (2006.01) |
| *H01L 21/67* | (2006.01) |

(52) U.S. Cl.
CPC .............. *H05B 3/02* (2013.01); *H05B 3/58* (2013.01); *H01L 21/67098* (2013.01); *H05B 2203/022* (2013.01)

(58) Field of Classification Search
None
See application file for complete search history.

(56) References Cited

U.S. PATENT DOCUMENTS

| | | | | |
|---|---|---|---|---|
| 4,687,907 | A | * 8/1987 | Barkley | B23K 3/047 228/234.1 |
| 5,632,919 | A | 5/1997 | MacCracken et al. | |
| 5,641,421 | A | * 6/1997 | Manov | F24H 3/002 148/403 |
| 5,714,738 | A | 2/1998 | Hauschulz et al. | |
| 6,035,102 | A | * 3/2000 | Bakke | A61M 5/44 165/46 |

(Continued)

*Primary Examiner* — Thor Campbell
(74) *Attorney, Agent, or Firm* — Charmasson, Buchaca & Leach, LLP

(57) ABSTRACT

A semi-flexible laminar silicone foam rubber-base heater for high temperature gas supply and exhaust lines used in microelectronic semiconductor fabrication uses superimposed adhesively bonded layers of an etched foil heater element containing layer, a high-to-low heat thermal transition layer, a thermal fuse laden silicone foam rubber insulation layer and a durable wrapping layer. The system can provide for the combined use of highly controllable etched foil heater elements, clean silicone foam rubber insulation, and inexpensive mechanical thermal fuses safely in a high heat gas supply and exhaust line environment.

17 Claims, 5 Drawing Sheets

(56) References Cited

U.S. PATENT DOCUMENTS

| | | | |
|---|---|---|---|
| 6,049,658 A * | 4/2000 | Schave | B05C 11/1042 |
| | | | 219/426 |
| 7,732,736 B2 * | 6/2010 | MacLean | G05D 23/27536 |
| | | | 219/221 |
| 7,919,733 B2 | 4/2011 | Ellis et al. | |
| 7,964,826 B2 | 6/2011 | Ellis et al. | |

* cited by examiner

HIGH TEMPERATURE GAS LINE HEATER SYSTEM INCLUDING SILICONE FOAM RUBBER

PRIOR APPLICATION

This application claims the benefit of U.S. Provisional Utility Patent Application Ser. No. 61/675,191, filed Jul. 24, 2012.

FIELD OF THE INVENTION

The instant invention relates to insulated conduit heater systems and more particularly to heater systems for gas supply and exhaust lines used in semiconductor fabrication.

BACKGROUND

Many industries such as the telecommunication, chemical, and pharmaceutical industries require heated conduit lines for fluids used in manufacturing. The microelectronic semiconductor fabrication industry in particular involves the need for highly regulated gas transmission lines leading to and from the fabrication vessels used to process semiconductor wafers. These specialized gasses are used for processing applications such as low pressure chemical vapor deposition (LPCVD), metal organic chemical vapor deposition (MOCVD), high density chemical vapor deposition (HDCVD), atomic layer deposition (ALD) and plasma etch.

Generally speaking, gas delivery and exhaust lines used in semiconductor fabrication can include all the components which carry gas from the gas canisters or bottles, to the process chamber, and thereafter to the abatement equipment or scrubbers. These components can include for example valves, regulators, mass flow controls, pumps, elbows, tees, reducers and manifolds. Exhaust lines which carry gasses away from the process chamber can also be referred to as fore lines, or pump lines.

Gas delivery and exhaust lines are typically made from stainless steel. Supply lines can typically have a diameter of between about 0.25 and 0.75 inch, while exhaust lines can typically range from between about 1.5 and 6.0 inches.

The gasses delivered to and removed from the wafer fabrication reaction chamber often must be kept within a narrow range of temperatures, typically between about 70 degrees centigrade (70° C.) and 250° C., in order primarily to prevent condensation from occurring in supply lines, and sublimation of materials in the exhaust lines. Condensation or sublimation can cause defects in semiconductor devices, reducing production yields and increase the need for more frequent and/or difficult costly maintenance.

Depending on the application gas supply and exhaust lines can be heated to temperatures between about 70° C. and 250° C. The evolution of fabrication processes appear to likely require even higher temperatures. Heating the transmission lines to such temperatures requires the use of heaters which need to be insulated from the surrounding environment for heat control and safety purposes. The heaters typically operate around the clock. Control of the temperature of the lines is usually to within +/-10° C. of a target temperature. Heat time from room temperature to the processing temperature varies but is often about 30 minutes.

A typical CVD tool can have up to 30 or more individual gas transmission line heaters internal to the tool which can be controlled individually or in a master/slave configuration. Gas supply canisters can be located several hundred feet away and require multiple heaters along the transmission line. Similarly, exhaust lines are often many tens of feet long leading to scrubbers or other abatement equipment.

Lines can be heated using a heater blanket or mantle heater which wraps around the gas carrying component such as a pipe. Some heaters use fiberglass insulation and sowing materials that can unfortunately generate unwanted particulates that contaminate the surroundings.

Heater equipment using wire wound heater elements covered by a silicone foam rubber insulating material has been developed as disclosed in Hauschulz et al., U.S. Pat. No. 5,714,738, incorporated herein by reference. Silicone foam rubber provides a much cleaner, flexible solution and can be readily adapted to carry inexpensive mechanical thermal fuses rather than more expensive electronic temperature limit control devices.

However, existing silicone foam rubber heaters suffer from not being able to withstand temperatures beyond about 162° C. for extended periods of time without becoming brittle and flaking apart, leading to premature failure. These temperatures also exceed the functional limit for mechanical thermal fuses.

Another problem with wire wound heater elements is that their temperature can more easily overshoot a preferred target temperature. Further, the heat flux provided by the wire wound element can be less uniform or consistent between separate regions of the heater element. Foil etch heater elements have been used which can provide greater control and uniformity of the heat generated by separate regions of the energized element.

The instant invention results from efforts to provide an improved gas transmission line heater system which addresses one or more of the above problems.

SUMMARY

The primary and secondary objects of the invention are to provide an improved gas line heater system. These and other objects are achieved by providing a specialized high-to-low heat transition layer located between a relatively high heat heater element layer and a relatively low heat-withstanding insulation layer using silicone foam rubber.

In some embodiments there is provided a device for heating a gas line, said device comprises: a thermal transition layer having a first surface and a second surface separated by a thickness; said transition layer comprising a thermally insulating material; a heater element containing layer adhesively bonded to said first surface; and, a foam insulation layer comprising silicone foam rubber material adhesively bonded to said second surface.

In some embodiments said thermal transition material and said thickness are selected to reduce the temperature from said first surface to said second surface by at least 90° C. while said heater element is held at an operational temperature of at least 250° C.

In some embodiments said heater element containing layer comprises an interfacing sublayer oriented to contact an outer surface of a gas line, wherein said interfacing sublayer comprises a heat transmissive material.

In some embodiments said heater element containing layer comprises a foil etch heater element.

In some embodiments said foil etch heater element is controllable to within +/-10° C. of said operational temperature.

In some embodiments said heater element containing layer comprises a wire wound heater element.

In some embodiments at least one mechanical thermal fuse is located in said foam insulation layer.

In some embodiments a wrapping layer is formed on an outer surface of said foam insulation layer.

In some embodiments an encapsulation structure is encapsulating said thermal transition layer.

In some embodiments said encapsulation structure comprises a sublayer of said heating element layer having a flap of material wrapping around a seam portion of said thermal transitional layer to contact a radially outer surface of said thermal transitional layer In some embodiments said foam insulation layer comprises material which cannot withstand temperatures exceeding 250° C.

In some embodiments said foam insulation layer comprises material which rated no greater than 180° C.

In some embodiments said foam insulation layer has a density of between about 200 kg/m$^3$ and about 280 kg/m$^3$.

In some embodiments said thermal transition layer comprises material which can withstand some temperatures exceeding 250° C.

In some embodiments there is provided a method for uniformly heating a semiconductor fabrication gas conduit, said method comprises: contacting an outer surface of said conduit with an etched foil heater element containing layer; interspersing a transition layer of heat dissipating material between said heater layer and a silicone foam rubber insulation layer; and, heating said heater layer to at least 250° C.

In some embodiments there is provided a method which further comprises embedding a mechanical thermal fuse within said silicone foam rubber insulation layer.

In some embodiments there is provided a method which further comprises dipping an axial end of said transitional layer in liquefied protective coating material during manufacture.

In some embodiments there is provided a method which further comprises forming an end wall of protective coating material over an axial end of said transition layer during manufacture.

In some embodiments there is provided a combination of a semiconductor fabrication vessel gas line having a heatable outer surface, and a line enwrapping heater having an inner surface shaped and dimensioned to intimately contact said outer surface; said heater comprises: a thermal transition layer having a first surface and a second surface separated by a thickness; said transition layer comprising a thermally insulating material; a heater element containing layer adhesively bonded to said first surface; and, an insulation layer comprising silicone foam rubber material adhesively bonded to said second surface; wherein said thermally insulating material and said thickness are selected to reduce the temperature of said second surface by at least 90° C. while said heater element is held at an operational temperature of at least 250° C.

The content of the original claims is incorporated herein by reference as summarizing features in one or more exemplary embodiments.

DESCRIPTION OF THE EXEMPLARY EMBODIMENTS

Figure 1:
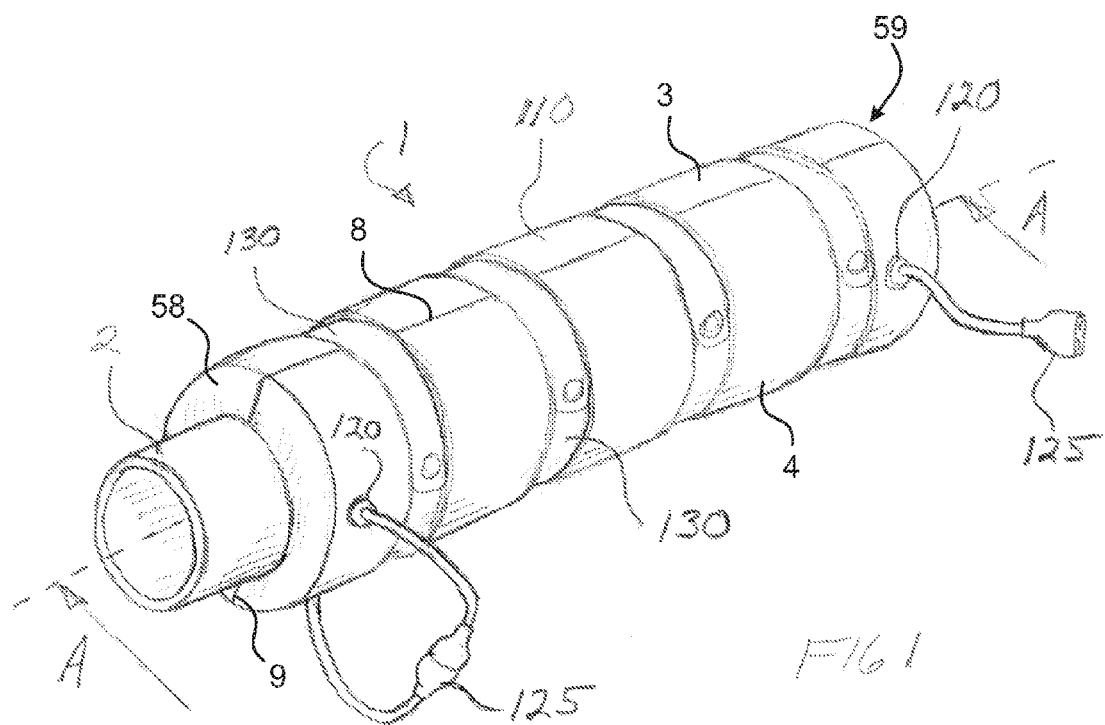
FIG. 1 is a diagrammatical perspective illustration a heater system according to an exemplary embodiment of the invention.
Figure 2:
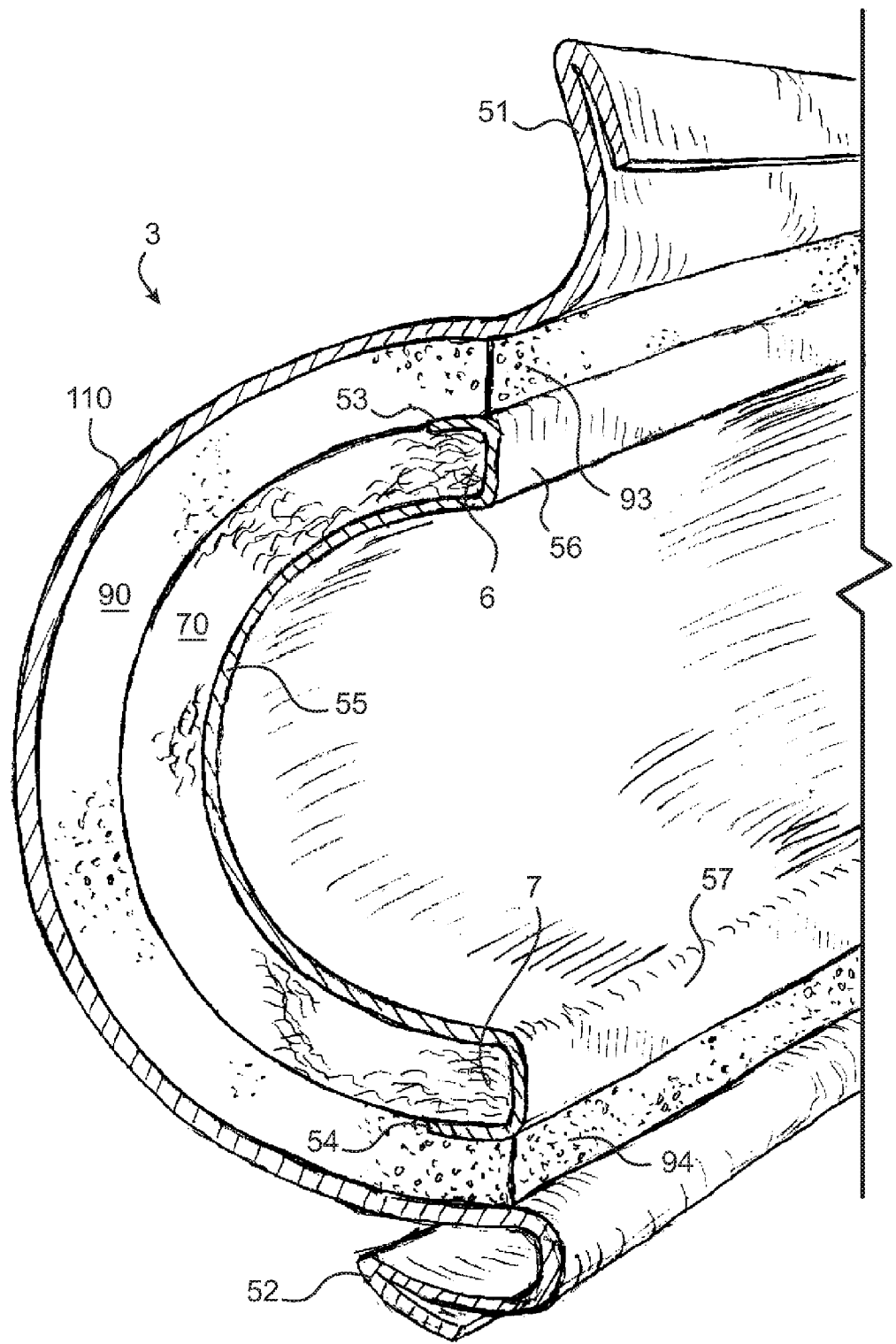
FIG. 2 is a diagrammatical perspective partial cross-sectional illustration of one half of the heater a heater system according to an exemplary embodiment of the invention.
Figure 3:
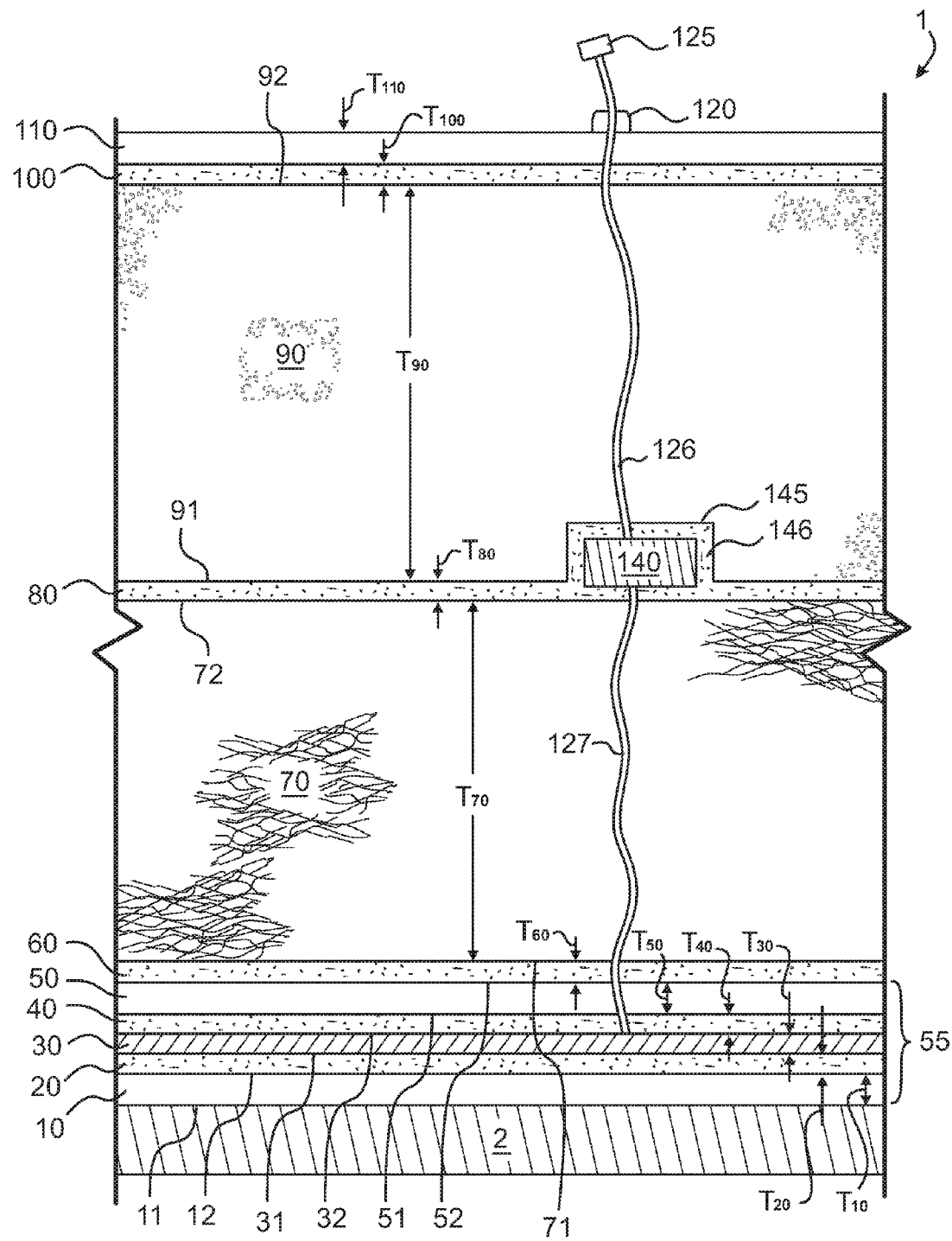
FIG. 3 is a diagrammatical partial cross-section side view of the system of FIG. 1 taken along line A-A.

Referring now to the drawing, there is illustrated in FIGS. 1-3 a system 1 used to heat a typically stainless steel transmission line 2 which carries a gas to or from a microelectronic semiconductor reaction chamber.

The system 1 generally comprises one or more interlocking and enwrapping cover pieces 3,4. For clarity, a linear gas line pipe 2 is shown having two pieces. Those skilled will readily appreciate adapting the design to more complex shapes such as elbows, T's, manifolds, and valve housings for example. The pieces can be intimately connected, electrically interconnected, releasably mountable upon the line.

Referring primarily to FIG. 2, each cover piece 3 can include a number of stacked, lamellarly successive layers including a heater element containing layer 55 located proximate to the gas line, a thermal transition layer 70, a silicone foam rubber insulation layer 90, and an outer coating or wrap layer 110. Each layer can be located radially adjacent or radially spaced apart from other layers. Some layers, such as the heater element containing layer can be made up of stacked, lamellarly successive sublayers including the element itself, insulating and bonding layers for example. The layers and sublayers can be bonded to adjacent layers or sublayers by a bonding material layer. For clarity, any bonding layers are not shown in FIG. 2.

In the case of cylindrical transmission line the layers can be coaxially and substantially cylindrically spaced apart from an inner location adjacent to the outer side wall of the gas line to an outer location on the outer surface of the heater piece. The term "inner" is used to refer to a location relatively closer to the gas line while the term "outer" is used to mean locations relatively further away from the gas line. When, for example, the gas line is a cylindrical pipe the term "inner" will generally refer to a radially proximal part of a cylindrically circumferential layer of material whereas "outer" will generally mean a radially distal part.

Further, each cover piece 3,4 can have end portions 58,59 which remain exposed or abut other heater systems. These end portions benefit from protection when these end portions are exposed. The end portions can be protected a generally radially extending end walls made from material similar to the wrap layer 110 or parts of the heater containing layer 55. Alternately, depending on the material used for the protective end walls, the end walls can be formed by dipping each of the axial ends of the heater cover pieces in liquified material which adheres to the ends and is then allowed to cure and solidify.

FIG. 2 shows that the heater element containing layer 55 can have parts forming seam flaps 56,57 which extend radially over the axially extending seam portions 6,7 of each piece. In other words, the heater cover pieces 3,4 can mate to one another or to themselves along one or more axially extending seams 8,9 which can include portions which benefit from protection while the pieces are unmated. In yet other words, while a heater system cover piece is unmated, seam portions could otherwise be exposed without separate covering structures such as the seam flaps. Thus the thermal transition layer 70 can be encapsulated by parts of the heater containing layer 55 including seam and end flaps, and the silicone foam rubber insulation layer 90. In order to provide a more rugged structure to the seam flaps, each flap can have an extension 53,54 which doubles back upon the radially outer surface of the transition layer and underneath a seam abutting portion 93,94 of the silicone foam rubber insulation layer. The wrap layer 110 can have overlaps 51,52 which are shaped and dimensioned to cover the seams between cover pieces The materials selected to form the various layers of the heater system are preferably selected so that they do not adversely interact with adjacent materials.

Referring now primarily to FIG. 3, the heater element containing layer 55 includes a plural number of lamellarly combined layers, namely a gas line interface layer 10, a heater element layer 30, an optional electrical isolation layer 50, and their respective bonding layers 20,30. Thus these layers can be referred to collectively as a heater element containing layer 55.

The interface layer 10 provides structurally reinforcing contact between the heater piece and the gas line. It can be made from electrically insulating, flexible, heat-transmissive material such as: polyimide; a polyimide film material such as Kapton brand material commercially available from the DuPont company of Wilmington, Del.; high temperature Kapton polyimide film (EKJ) available from the DuPont company; perfluoroelastomer (FFKM); a thermosetting, thermoplastic elastomeric material such as perfluoroalkoxy (PFA) available from the DuPont company; polyether ether ketone (PEEK) available from Victrex USA Inc. of West Conshohocken, Pa.; UPIEX-VT polyimide film available from UBE America Inc. of New York, N.Y.; a thermosetting elastomeric material such as Kalrez brand material also commercially available from the DuPont company; Simriz brand material commercially available from the Simrit company of Elgin, Ill.; Tecnoflon brand material commercially available from the Solvay company of Cincinatti, Ohio; silicone room temperature vulcanization (RTV) materials such as Sylgard brand material commercially available from the Dow Corning company of Midland, Mich.; and, liquid silicone rubber (LSR) material commercially available from the Momentive company of Columbus, Ohio. This material can withstand the relatively high temperature generated by the heater which can exceed about 250° C.

The interface layer 10 has an inner surface 11 and outer surface 12. The inner surface is oriented to intimately contact the outer surface 3 of a stainless steel transmission line 2. For many applications the interface layer can have a thickness $T_{10}$ of between about 0.05 millimeter (0.002 inch) and about 0.6 millimeter (0.022 inch).

The interface layer has an outer surface 12 which is adhesively and flexibly bonded to the inner surface 31 of a heater element layer 30 by a bonding layer 20 having a thickness $T_{20}$ of between about 0.013 millimeter (0.0005 inch) and about 0.2 millimeter (0.0075 inch). made from an electrically insulating adhesive material such as PEEK, PFA, fluorinated ethylene propylene (FEP) available from the DuPont company, polytetrafluoroethylene (PTFE) available from the DuPont company, polyimide, perfluoroelastomer (FFKM), a thermoset elastomer material such as those described with respect to the interface material above, RTV material, and LSR material. This bonding layer material can withstand the relatively high temperature generated by the heater which can exceed about 250° C. It is the adhesive properties of these materials that allow it to bond to both the interface layer 10 and the heater layer 30. Further, both the interface layer 10 and the bonding layer 20 can be the same material and potentially formed together as a single monolithic layer.

The heater element layer includes a foil etch-type heater element made from one or more serpentine traces of stainless steel or other electrically resistive metallic material such as inconel, a nickel-based alloy material commercially available from ATI Allegheny Ludlum company of Pico Rivera, Calif. Alternately a wire wound heater element can be used for some applications such as when the heater will be subjected to extreme flexing. A foil etch-type element can provide a more even distribution of heat across the contact surface between the heater and the transmission line, and greater control of the power consumed by multiple elements. This can result in a higher thermal transfer rate, thus allowing more rapid adjustment of temperature. The heater element layer can also include a plurality of temperature sensors such as thermocouples. For many applications the foil etch heater element can have a thickness $T_{30}$ of between about 0.006 millimeter (0.00025 inch) and about 0.13 millimeter (0.005 inch).

The outer surface 32 of the heater element layer is adhesively and flexibly bonded to the bottom surface 51 of an optional electrical isolation layer 50 by a bonding layer 40 of electrically insulating adhesive which can be the same material used to form the layer 20 bonding the interface layer to the heater element layer. For many applications the bonding layer 40 can have a thickness $T_{40}$ of between about 0.013 millimeter (0.0005 inch) and about 0.2 millimeter (0.0075 inch).

The two electrically insulating bonding adhesive layers 20,40 sandwiching the heater element layer 30 can fully encapsulate the heating element. Thus, portions of the insulating bonding layers may contact one another in those regions where the serpentine heating element leaves gaps.

The electrical isolation layer 50 can be made of the same material used in the interface layer 10 and for many applications can have a thickness $T_{50}$ of between about 0.05 millimeter (0.002 inch) and about 0.6 millimeter (0.022 inch). This material can withstand the relatively high temperature generated by the heater which can exceed about 250° C.

The outer surface 52 of the electrical isolation layer 50 is adhesively and flexibly bonded to the inner surface 71 of a thermal transition layer 70 by a bonding layer 60 of adhesive which can be the same material used to form the layer 20 bonding the interface layer to the heater element layer. For many applications the bonding layer 60 can have a thickness $T_{60}$ of between about 0.05 millimeter (0.002 inch) and about 0.4 millimeter (0.015 inch).

Optionally, the electrical isolation layer 50 and its superimposed bonding layer 60 can be eliminated so that the heater element layer 30 bonds directly to the thermal transition layer 70 through a bonding layer 40 sandwiched therebetween.

The thermal transition layer 70 has an inner surface 71 and outer surface 72 spaced apart by a thickness $T_{70}$ of preferably between about 1.6 millimeter (0.0625 inch) and about 12.7 millimeter (0.5 inch), and for many applications can be about 5.0 millimeter (0.2 inch) and is made from a material which allows the outer surface to maintain a temperature of at least 90° C. less than the temperature at the inner surface when the heater element is at an operational temperature of at least 250° C. and the system is located in a space at room temperature. In this way the thermal transition layer is dimensioned and the material selected so that it acts as a high-to-low heat diffusion layer.

Preferred materials for the thermal transition layer 70 include materials such as relatively high temperature insulating batting commercially available under the brand name PE-Glass from Basalt Specialty Products Inc., of Elkin, N.C., or under the brand name Pyrogel from the Aerogel company of Northborough, Mass.; thin profile thermal insulation such as Insulthin brand material commercially available from the Arlon company of Bear, Del.; high temperature wool fiberglass insulation material commercially available from Owens Corning company of Toledo, Ohio, and various combinations thereof. This material can withstand the relatively high temperature generated by the heater which can exceed about 250° C. This material can include non-foam silicone rubber.

The outer surface 72 of the thermal transition layer 70 is adhesively and flexibly bonded to the bottom surface 91 of a silicone foam rubber insulation layer 90 by a bonding layer 80 of adhesive such as silicone RTV, LSR both available from Dow Corning of Midland, Mich., and heat cure rubber (HCR) in sheet form commercially available from Arlon company of Bear, Del. for example. For many applications the bonding layer 80 can have a thickness $T_{80}$ of between about 0.05 millimeter (0.002 inch) and about 0.4 millimeter (0.015 inch). The silicone foam rubber insulation layer can be formed in direct contact with the thermal transition layer thus eliminating the bonding layer 80. The nature of the two contacting materials can provide an adequate degree of adherence between the two layers.

The silicone foam rubber insulation layer 90 has an inner surface 91 and outer surface 92 spaced apart by a thickness $T_{90}$ of preferably between about 3.2 millimeter (0.125 inch) and about 12.7 millimeter (0.5 inch) depending on the characteristics of the selected material and its application. The thickness is selected to reduce the temperature to no more than about 75° C. at the outer surface when heater is at an operational temperature of at least 250° C. and the system is located in a space at room temperature.

Preferred materials for the silicone foam rubber insulation layer 90 include materials such as low temperature insulating foam rubber such as 3-8109 brand silicone foam commercially available from Dow Corning of Midland, Mich., or RTF7000 brand foam commercially available from Momentive of Columbus, Ohio. The foam is preferably a closed cell-type foam for greater insulation and for most applications can have a density of between about 200 kilograms per cubic meter ($kg/m^3$) (12.5 pounds per cubic foot ($lbs/ft^3$)) and about 280 $kg/m^3$ (17.5 $lbs/ft^3$). This type of silicone foam rubber can also be characterized by its temperature rating which for most applications will be no greater than 180° C., which will effectively preclude use in applications where the temperature is expected to exceed about 165° C. This material cannot withstand the relatively high temperature generated by the heater which can exceed about 250° C. This type of silicone foam rubber material can also be characterized by its durometer which can be between about 45 and about 50 on a Shore OO scale.

The outer surface 92 of the silicone foam rubber insulation layer 90 is adhesively and flexibly bonded to the bottom surface 111 of a coating or wrap layer 110 by a bonding layer 100 of adhesive such as adhesive such as silicone RTV, LSR, and HCR in sheet form. For many applications the bonding layer 100 can have a thickness $T_{100}$ of between about 0.05 millimeter (0.002 inch) and about 0.4 millimeter (0.015 inch). The wrap layer can be made from a durable, flexible material which can act as a mechanical substrate for the entry 120 for the electrical interconnect wiring termination bundles 125 which provide an electrical connections 126, 127 to the heater elements, thermal sensors and thermal fuses 140, and attachment hardware such a snap together binding straps 130. For many applications the wrap layer 110 can have a thickness $T_{110}$ of between about 0.4 millimeter (0.015 inch) and about 0.7 millimeter (0.028 inch).

The lowering of the temperature achieved by the thermal transition layer from an operational temperature of the heater element allows for the use of inexpensive mechanical thermal fuses 140 which can be located within pockets 145 formed in the silicone foam rubber insulation layer 90. Each fuse 140 can be held within its pocket 145 by a surrounding layer of adhesive 146.

Figure 4:
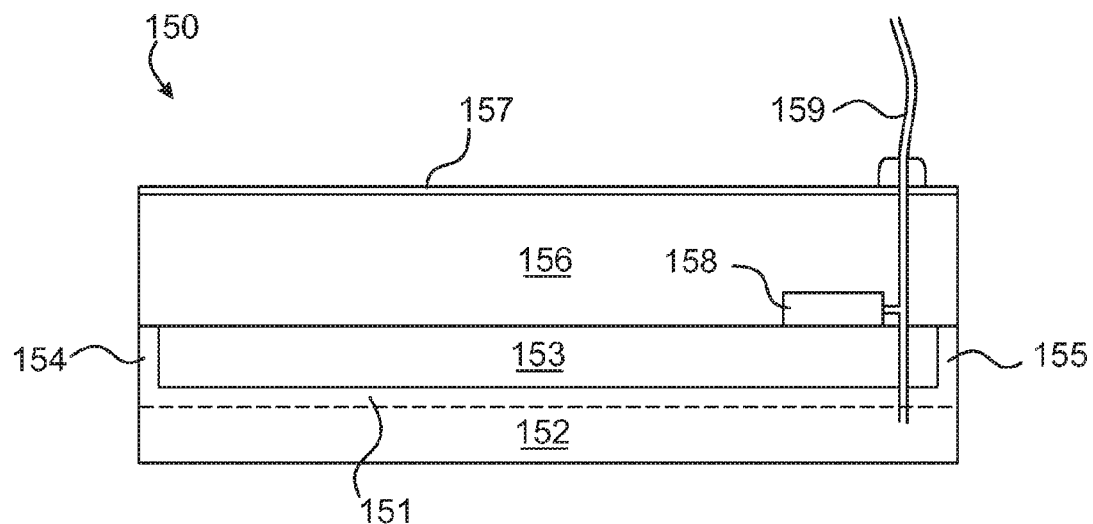
FIG. 4 is a diagrammatical cross-section side view of an alternate embodiment of a heater system including end walls for containing the thermal transition layer as an extension of the electrical isolation layer part of the heater containing layer.

Referring now to FIG. 4, there is shown an alternate heater system 150 similar to the embodiment of FIGS. 1-3 but where an electrical isolation layer 151 forming the outer layer of a heater element containing layer 152 is formed to have a pair of radially extending end walls 154,155 formed integrally with the electrical isolation layer in order to encapsulate the thermal transition layer 153 between the electrical isolation layer, end walls and a silicone foam rubber insulation layer 156 beneath a wrapping layer 157. This structure thus encapsulates the thermal transition layer and is consistent with providing mechanical thermal fuses 158 and electrical interconnect wiring 159. In this way the thermal transition layer can use materials which are more prone to forming unwanted particulates while still protecting against the release of those particulates outside the heater system.

Figure 5:
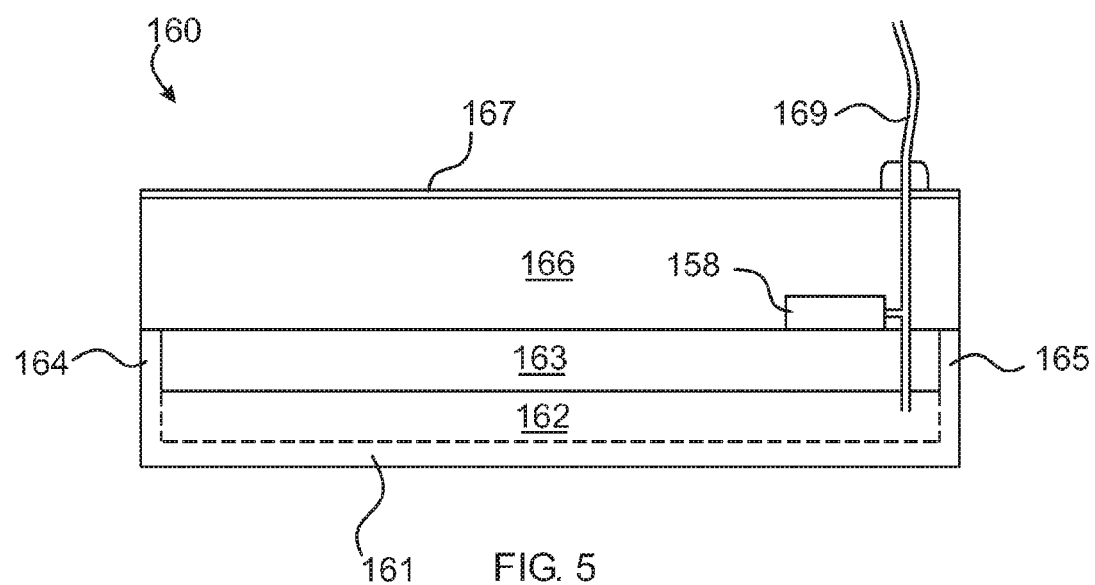
FIG. 5 is a diagrammatical cross-section side view of an alternate embodiment of a heater system including end walls for containing the thermal transition layer as an extension of the gas line interface layer part of the heater containing layer.

Alternately, as shown in the heater system 160 of FIG. 5, the gas line interface layer 161 forming the inner layer of a heater element containing layer 162 is formed to have a pair of radially extending end walls 164,165 formed integrally with the gas line interface layer in order to encapsulate the thermal transition layer 163 between the heater element containing layer 162, the end walls and a silicone foam rubber insulation layer 166 beneath a wrapping layer 167. This structure thus encapsulates the thermal transition layer and is consistent with providing mechanical thermal fuses 168 and electrical interconnect wiring 169. In this way the thermal transition layer can use materials which are more prone to forming unwanted particulates while still protecting against the release of those particulates outside the heater system.

Figure 6:
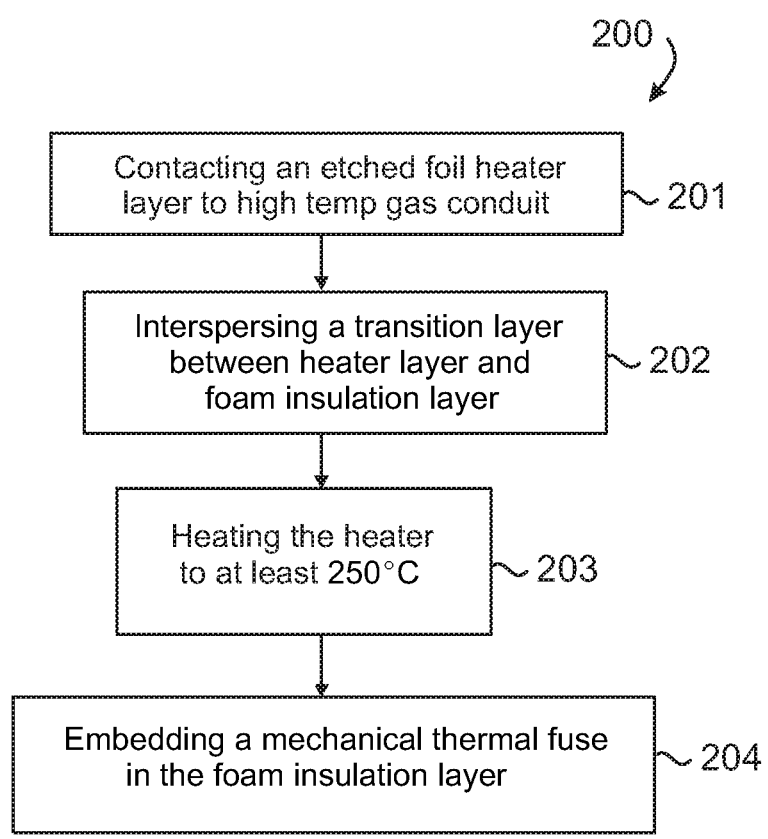
FIG. 6 is a flow chart diagram of a heating process according to an exemplary embodiment of the invention.

Referring now to FIG. 6 there is described a method 200 for uniformly heating a semiconductor fabrication gas conduit, which includes: contacting an outer surface of a high temperature gas transmission line conduit with an etched foil heater element containing layer 201; interspersing a transition layer of heat dissipating material between the heater element containing layer and a silicone foam rubber insulation layer 202; heating the heater layer to at least 250° C.; and, embedding a mechanical thermal fuse within the silicone rubber insulation layer.

EXAMPLE

The following is a structural example of the materials and thicknesses of heater system.

| Layer | Material | Thickness (in inches) |
|---|---|---|
| Interface | Fiberglass impregnated silicone rubber - high temperature | 0.022 |
| Adhesive | High temperature silicone rubber | 0.0075 |
| Heater element | Inconel foil-type | 0.001 |
| Adhesive | High temperature silicone rubber | 0.0075 |
| Electrical Isolation | Fiberglass impregnated silicone rubber - high temperature | 0.022 |
| Adhesive | High temperature silicone rubber | 0.015 |
| Thermal Transition | Pyrogel brand insulation | 0.2 |
| Adhesive | Sheeted silicone rubber | 0.015 |
| Silicone foam rubber insulation | Non-high temperature silicone foam rubber | 0.2 |
| Adhesive | Sheeted silicone rubber | 0.005 |
| Wrapping | Fiberglass impregnated silicone rubber | 0.028 |

By using foil etch heater elements the temperature of the heater can be controlled to a greater degree thus allowing for the proper selection of the thermal transition layer material and its dimensioning.

In this way, silicone foam rubber can be used as the insulating material on a heater which can be operated at much higher temperatures and for longer periods of time than earlier silicone foam rubber-based heater systems. Further, inexpensive mechanical thermal fuses can be used in higher heat applications. Further, the exemplary embodiment provides for a laminar structure which can be adapted to unwrap gas line components having more complex shapes such as valves, regulators, mass flow controls, pumps, elbows, tees, reducers and manifolds.

While the preferred embodiment of the invention has been described, modifications can be made and other embodiments may be devised without departing from the spirit of the invention and the scope of the appended claims.

What is claimed is:

1. A device for heating a gas line, said device comprises:
a thermal transition layer having a first surface and a second surface separated by a thickness;
said thermal transition layer comprising a thermally insulating material;
a heater element containing layer adhesively bonded to said first surface;
a foam insulation layer comprising silicone foam rubber material adhesively bonded to said second surface; and,
an encapsulation structure encapsulating said thermal transition layer;
wherein said encapsulation structure comprises a sublayer of said heating element layer having a flap of material wrapping around a seam portion of said thermal transitional layer to contact a radially outer surface of said thermal transitional layer.

2. The device of claim 1, wherein said thermal transition material and said thickness are selected to reduce the temperature from said first surface to said second surface by at least 90° C. while said heater element is held at an operational temperature of at least 250° C.

3. The device of claim 1, which further comprises:
wherein said sublayer is oriented to contact an outer surface of a gas line, wherein said sublayer comprises a heat transmissive material.

4. The device of claim 2, wherein said heater element containing layer comprises a foil etch heater element.

5. The device of claim 4, wherein said foil etch heater element is controllable to within +/−10° C. of said operational temperature.

6. The device of claim 2, wherein said heater element containing layer comprises a wire wound heater element.

7. The device of claim 1, which further comprises at least one mechanical thermal fuse located in said foam insulation layer.

8. The device of claim 1, which further comprises a wrapping layer formed on an outer surface of said foam insulation layer.

9. The device of claim 1, wherein said foam insulation layer comprises material which cannot withstand temperatures exceeding 250° C.

10. The device of claim 1, wherein said foam insulation layer comprises material which rated no greater than 180° C.

11. The device of claim 1, wherein said foam insulation layer has a density of between about 200 kg/m$^3$ and about 280 kg/m$^3$.

12. The device of claim 1, wherein said thermal transition layer comprises material which can withstand some temperatures exceeding 250° C.

13. A method for uniformly heating a semiconductor fabrication gas conduit, said method comprises:
contacting an outer surface of said conduit with an etched foil heater element containing layer;
interspersing a transition layer of heat dissipating material between said heater layer and a silicone foam rubber insulation layer;
encapsulating said transition layer;
wherein said encapsulating comprises:
wrapping a flap of material in a sublayer of said etched foil heater element layer around a seam portion of said transition layer to contact a radially outer surface of said transitional layer; and,
heating said heater layer to at least 250° C.

14. The method of claim 13, which further comprises:
embedding a mechanical thermal fuse within said silicone foam rubber insulation layer.

15. The method of claim 13, which further comprises:
dipping an axial end of said transitional layer in liquefied protective coating material during manufacture.

16. The method of claim 13, which further comprises:
forming an end wall of protective coating material over an axial end of said transition layer during manufacture.

17. The combination of a semiconductor fabrication vessel gas line having a heatable outer surface, and a line enwrapping heater having an inner surface shaped and dimensioned to intimately contact said outer surface; said heater comprises:
a thermal transition layer having a first surface and a second surface separated by a thickness;
said thermal transition layer comprising a thermally insulating material;
a heater element containing layer adhesively bonded to said first surface;
an insulation layer comprising silicone foam rubber material adhesively bonded to said second surface;
wherein said thermally insulating material and said thickness are selected to reduce the temperature of said second surface by at least 90° C. while said heater element is held at an operational temperature of at least 250° C.; and,
an encapsulation structure encapsulating said thermal transition layer;
wherein said encapsulation structure comprises a sublayer of said heater element containing layer having a flap of material wrapping around a seam portion of said thermal transitional layer to contact a radially outer surface of said thermal transitional layer.

* * * * *